United States Patent
Thevenin et al.

(10) Patent No.: US 10,382,055 B2
(45) Date of Patent: Aug. 13, 2019

(54) DIGITAL DATA COMPRESSION

(71) Applicant: COMMISSARIAT A L'ENERGIE ATOMIQUE ET AUX ENERGIES ALTERNATIVES, Paris (FR)

(72) Inventors: Mathieu Thevenin, Saclay (FR); Olivier Thomine, Montrouge (FR); Guillaume Latu, Manosque (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/062,485

(22) PCT Filed: Dec. 15, 2016

(86) PCT No.: PCT/EP2016/081284
§ 371 (c)(1),
(2) Date: Jun. 14, 2018

(87) PCT Pub. No.: WO2017/103002
PCT Pub. Date: Jun. 22, 2017

(65) Prior Publication Data
US 2019/0044532 A1 Feb. 7, 2019

(30) Foreign Application Priority Data
Dec. 16, 2015 (FR) ..................... 15 62553

(51) Int. Cl.
*H03M 7/30* (2006.01)
*H04L 29/06* (2006.01)

(52) U.S. Cl.
CPC ....... *H03M 7/3068* (2013.01); *H03M 7/3062* (2013.01); *H03M 7/3077* (2013.01); *H03M 7/6029* (2013.01); *H04L 69/04* (2013.01)

(58) Field of Classification Search
CPC ............. H03M 7/3068; H03M 7/3062; H03M 7/6029; H04L 69/04
(Continued)

(56) References Cited

U.S. PATENT DOCUMENTS

| 4,546,342 A | 10/1985 | Weaver et al. |
| 5,982,938 A * | 11/1999 | Dube ................... H04N 19/647 375/E7.047 |

(Continued)

FOREIGN PATENT DOCUMENTS

| WO | WO 85/02732 A1 | 6/1985 |
| WO | WO 2012/059124 A1 | 5/2012 |

OTHER PUBLICATIONS

International Search Report dated Feb. 27, 2016 in PCT/EP2016/081284 (with English translation), 9 pages.

(Continued)

Primary Examiner — Brian K Young
(74) Attorney, Agent, or Firm — Oblon, McClelland, Maier & Neustadt, L.L.P.

(57) ABSTRACT

A method for compressing digital data, including: extrapolating a value of each sample of data to be compressed as a function of a value of at least one preceding sample, to produce an extrapolated sample; differentiating between each extrapolated sample and the corresponding sample of data to be compressed, to produce a differentiated sample; and deleting redundancy between successive differentiated samples produced by the differentiating stage.

9 Claims, 4 Drawing Sheets

(58) Field of Classification Search
USPC .......................................... 341/87, 106, 107
See application file for complete search history.

(56) References Cited

U.S. PATENT DOCUMENTS

| | | | | |
|---|---|---|---|---|
| 6,647,064 | B1* | 11/2003 | Eguchi | H04B 14/046 |
| | | | | 375/245 |
| 7,286,714 | B2* | 10/2007 | Bard | H04N 19/197 |
| | | | | 375/E7.13 |
| 7,429,938 | B1* | 9/2008 | Corndorf | H03M 7/40 |
| | | | | 341/155 |
| 2013/0293400 | A1 | 11/2013 | Gervais | |

OTHER PUBLICATIONS

Mohammad Arif, et al., "Effect on Speech Compression by Combined Delta Encoding and Huffman Coding Scheme" Wireless Personal Communications, vol. 79, No. 3, XP055292432, Aug. 28, 2014, pp. 2371-2381.

* cited by examiner

DIGITAL DATA COMPRESSION

TECHNICAL FIELD

The present invention relates to digital data compression. It applies to a large number of fields, for example the transmission or the storage of signals such as images or sounds.

PRIOR ART

Data compression techniques frequently comprise a detection of repetition of patterns. The repeated patterns are next encoded from symbols requiring less data than the original data.

Moreover, it is possible to condition the data before the compression thereof, in such a way as to make redundancies appear capable of improving this type of encoding.

It is further possible to determine the variations in the consecutive data, and to only encode these variations, as in U.S. Pat. Nos. 6,327,671 or 6,038,536.

The article entitled "The FPC Double-Precision floating-point compression Algorithm and its implementation", of M. Burtscher & P. Ratanaworabhan, concerns a technique for compressing data with losses. It may be seen in FIG. 1 that an error from a decompression with loss is determined. The error thereby determined is compressed. This technique thus involves operations of compressing and decompressing data in the single compressing phase.

The article "Effect on Speech Compression by Combined Delta Encoding and Huffman Coding Scheme" of Mohammad Arif et al., Wireless Personal Communications, vol. 79, no 3, 28 Aug. 2014, pages 2371-2381, discloses a compression of a speech signal that firstly comprises a delta encoding which consists in leaving unchanged a first signal sample then calculating the successive differences between successive samples of the signal. This delta-encoded signal next undergoes a Huffman coding. This compression of data is a compression with losses in the case of floating point numbers.

DESCRIPTION OF THE INVENTION

The invention aims to resolve the problems of the prior art by providing a method for compressing digital data, characterised in that it comprises the steps of:

Extrapolating the value of each sample of data to be compressed as a function of the value of at least one preceding sample, in order to produce an extrapolated sample, Differentiating between each extrapolated sample and the corresponding sample of data to be compressed, in order to produce a differentiated sample, Deleting redundancy between successive differentiated samples produced by the differentiating step.

Thanks to the invention, the data are compressed without loss. The compression used is an algorithm of order N, thus of linear complexity, which corresponds to the most rapidly speed theoretically attainable.

The necessary computing time remains short.

The roll-out cost remains limited. In particular, the invention may be implemented at lower cost on silicon chip.

The invention is advantageous in numerous applications, because it enables an increase in the data rate transmitted on a channel of limited passband or instead an increase in the volume of data stored in a memory of given size.

According to a preferred characteristic, the extrapolation of the value of a sample of data to be compressed is a copy of the preceding sample. This type of extrapolation is simple to implement.

According to a preferred characteristic, the method for compressing digital data comprises a step of conditioning each sample of data to be compressed in such a way as to format the data to be compressed. The formatting can facilitate later processing operations.

According to a preferred characteristic, the method for compressing digital data comprises a step of concatenation of successive differentiated samples in which the redundancy has been deleted.

The invention also relates to a method for decompressing digital data compressed by the method described previously, characterised in that it comprises the steps of:

Re-introducing redundancy into the compressed signal, in order to produce reconstituted samples, De-differentiating between each reconstituted sample and a corresponding estimated sample, in order to produce a de-differentiated sample, Estimating the value of each following estimated sample from the value of at least one previously produced de-differentiated sample.

According to a preferred characteristic, the estimation of the value of a following estimated sample is carried out by the same function as for the extrapolation during data compression.

The invention also relates to a data compression device, characterised in that it comprises:

Means for extrapolating the value of each sample of data to be compressed as a function of the value of at least one preceding sample, in order to produce an extrapolated sample, Means for differentiating between each extrapolated sample and the corresponding sample of data to be compressed, in order to produce a differentiated sample, Means for deleting redundancy between successive differentiated samples produced by the differentiating step.

The invention also relates to a device for decompressing data compressed by the device described previously, characterised in that it comprises:

Means for re-introducing redundancy into the compressed signal, in order to produce reconstituted samples, Means for de-differentiating between each reconstituted sample and a corresponding estimated sample, in order to produce a de-differentiated sample, Means for estimating the value of each following estimated sample from the value of at least one previously produced de-differentiated sample.

For the decompression, there is thus a re-looping of the estimation of the samples.

The decompression method and the compression and decompression devices have advantages analogous to those described previously.

In a particular embodiment, the steps of the method according to the invention are implemented by computer programme instructions.

Consequently, the invention also relates to a computer programme on an information support, said programme being capable of being implemented in a computer, said programme comprising instructions adapted to the implementation of the steps of a method as described above.

This programme may use any programming language, and be in the form of source code, object code, or intermediate code between source code and object code, such as in a partially compiled form, or in any other desirable form.

The invention also relates to an information support which can be read by a computer, and comprising computer programme instructions adapted to the implementation of the steps of a method as described above.

The information support may be any entity or device capable of storing the programme. For example, the support may comprise a storage means, such as a ROM, for example a CD ROM or a microelectronic circuit ROM, or instead a magnetic recording means, for example a floppy disk or a hard disk.

Furthermore, the information support may be a transmissible support such as an electrical or optical signal, which may be routed via an electrical or optical cable, by radio or by other means. The programme according to the invention may be in particular downloaded on an Internet type network.

Alternatively, the information support may be an integrated circuit in which the programme is incorporated, the circuit being adapted to execute or to be used in the execution of the method according to the invention.

The compression and decompression devices according to the invention may be implemented on circuit, for example by direct assembly of transistors or logic gates.

BRIEF DESCRIPTION OF THE DRAWINGS

Other characteristics and advantages will become clear on reading the following description of a preferred embodiment, given by way of non-limiting example, described with reference to the figures in which.

DETAILED DESCRIPTION OF PARTICULAR EMBODIMENTS

Figure 1:
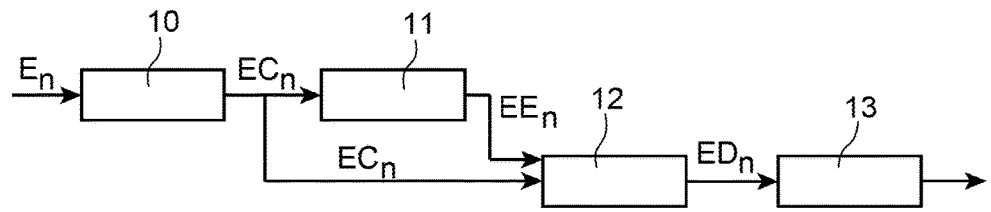
FIG. 1 represents a device for compressing digital data according to an embodiment of the invention.

According to a preferred embodiment, represented in FIG. 1, the digital data compression device comprises a conditioning module 10 which receives the data to be compressed.

Samples of data which are octets are considered as an example in the remainder of the description. Obviously, it is possible to consider words of different size, strictly greater than 1 bit, for example 32 or 64 bits.

Conditioning is an optional operation of formatting data with the aim of facilitating the work of following modules and thus improving the performance of the device. The conditioning of data is for example the encoding of data according to a Gray code, which makes it possible to only modify a single bit at a time when a number is increased by one unit. It is also possible to change the endianness of the signal (big endian, little endian), or instead to modify the emplacement of the sign bit, in order to adapt the order of the bits to later processing operations.

An output of the conditioning module 10 is connected to an input of an extrapolation module 11. The conditioning module 10 receives samples of data to be compressed $E_n$, and delivers samples of conditioned data to be compressed $EC_n$ to the extrapolation module 11. The integer n represents a current sample index, varying between 1 and a value N.

If the device does not comprise a conditioning module, the extrapolation module 11 receives the samples of data to be compressed $E_n$ and applies its processing operations to them.

The extrapolation module 11 applies to the samples that it receives an extrapolation function that produces an estimation of the value of the current sample. Different extrapolation functions may be implemented. Preferably, the extrapolation function depends on the nature of the signal to be compressed.

As an example, the extrapolation function estimates the value of the current sample $EC_n$ as a function of the value of at least one preceding sample $EC_{n-1}$, $EC_{n-2}$, etc. In this case, the extrapolation function is for example a copy of the preceding sample. It may also be a function, linear or not, of several preceding samples. Alternatively, it may further be a parabolic or exponential function.

If the extrapolation function estimates the value of the current sample $EC_n$ as a function of the value of at least one preceding sample $EC_{n-1}$, $EC_{n-2}$, etc., this gives: $EE_n = f(EC_{n-1}, EC_{n-2}, \ldots)$, where $EE_n$ represents a current extrapolated sample. If the extrapolation function is a copy of the preceding sample, this gives: $EE_n = EC_{n-1}$.

An output of the extrapolation module 11 is connected to an input of a differentiating module 12. The extrapolation module 11 delivers the estimated, or extrapolated, samples $EE_n$ to the differentiating module 12.

Similarly, the output of the conditioning module 10 is connected to an input of the differentiating module 12. The conditioning module 10 delivers samples of conditioned data to be compressed $EC_n$ to the differentiating module 12.

If the device does not comprise a conditioning module, the differentiating module 12 receives the samples of data to be compressed $E_n$.

The differentiation implements a deterministic function which associates a single value of differentiated sample $ED_n$ with a pair of values of conditioned sample and corresponding extrapolated sample ($EC_n$, $EE_n$).

The values of conditioned sample $EC_n$ and corresponding extrapolated sample $EE_n$ are a priori close, if the extrapolation works well. The differentiation function exploits the redundancy existing between the values of conditioned sample $EC_n$ and corresponding extrapolated sample $EE_n$. For example, the extrapolation function is the function XOR applied bit by bit to the values of conditioned sample $EC_n$ and corresponding extrapolated sample $EE_c$. In an alternative, the extrapolation function is an unsigned subtraction.

An output of the differentiating module 12 is connected to an input of a module for deleting redundancy 13. The differentiating module 12 delivers the differentiated samples $ED_n$ to the module for deleting redundancy 13.

Figure 2:
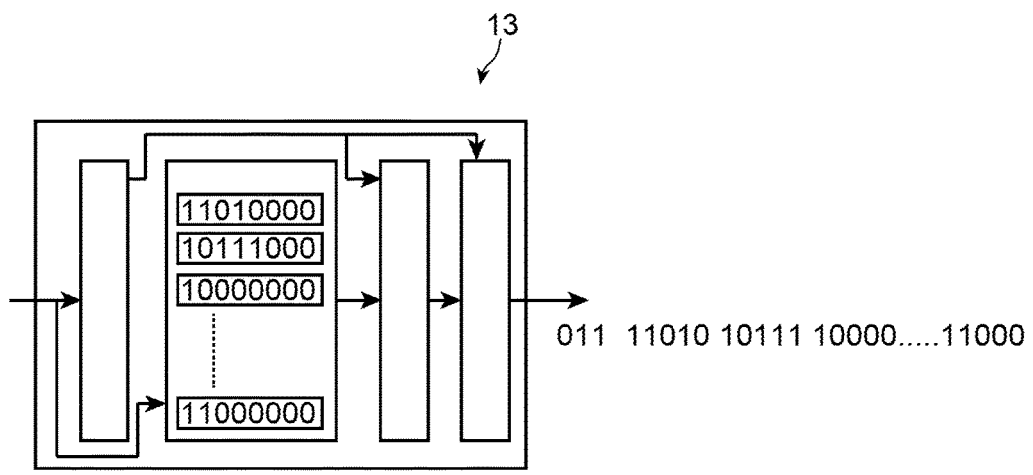
FIG. 2 represents an embodiment of module for deleting redundancy implemented in the device of FIG. 1.

FIG. 2 represents an embodiment of module for deleting redundancy 13 that works on blocks of P successive values of differentiated samples and determines the redundancy between said P values. For example, the result is the number NB of successive most significant bits which have as value "0" in each of the P differentiated samples considered. According to other implementations, it is also possible to consider the successive most significant bits which have as value "1" in each of the P differentiated samples considered, or instead the successive redundant least significant bits. The value P is predetermined, or in an alternative, it is variable and is encoded in the compression data.

The P successive values of differentiated samples are memorised then truncated from the NB successive redundant bits.

Finally, the P truncated values, that is to say the non-redundant parts of the P successive values of differentiated samples, are concatenated. The output signal of the module 13 is the signal of compressed data produced by the compression device according to the invention. The output signal of the module 13 comprises words of which each corresponds to P values processed and is formed from the number NB and the P truncated values.

Figure 3:
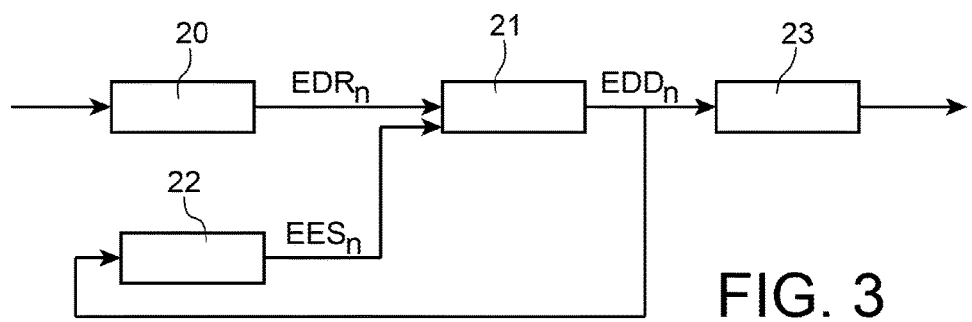
FIG. 3 represents a device for decompressing digital data according to an embodiment of the invention.

FIG. 3 represents an embodiment of device for decompressing data compressed by the device of FIG. 1.

The decompression device comprises a de-concatenation module 20 which receives the compressed signal and carries out operations opposite to those of the module for deleting redundancy 13 described previously.

In the case of deleting redundancy realised as in the example described with reference to FIG. 2, the de-concatenation module 20 reads the number NB and the P truncated values of a received word. It adds the NB bits that had been truncated to each of the P values of the received word. For example, it adds NB most significant bits which have as value "0". The module 20 carries out a re-introduction of redundancy into the data that it receives and thereby reconstitutes the values of the differentiated samples. A reconstituted differentiated sample $EDR_n$ is identical to the corresponding sample produced by the differentiating module 12 of the data compression device. A reconstituted differentiated sample $EDR_n$ represents the error of the extrapolation function applied by the module 12 during data compression.

An output of the de-concatenation module 20 is connected to an input of a de-differentiating module 21. The de-concatenation module 20 delivers the reconstituted differentiated samples $EDR_n$ to the de-differentiating module 21.

An output of an estimation module 22 is connected to another input of the de-differentiating module 21. An output of the de-differentiating module 21 is connected to an input of the estimation module 22.

The estimation module 22 uses a function identical to that used by the extrapolation module 11 of the data compression device. From the previously de-differentiated samples $EDD_n$ supplied by the de-differentiating module 21, the estimation module 22 produces estimated samples $EES_n$. For example, if the estimation function is a copy of the preceding sample, this then gives: $EES_n = EDD_{n-1}$, where $EDD_{n-1}$ represents the previously de-differentiated sample.

These estimated samples $EES_n$ are supplied to the de-differentiating module 21 which applies a function opposite to the function applied by the differentiating module 12 of the data compression device. The de-differentiating module 21 produces a de-differentiated sample $EDD_n$ as a function of the estimated sample $EES_n$ and the corresponding reconstituted differentiated sample $EDR_n$ supplied by the module 20.

According to a preferred embodiment, the differentiating function is the function "XOR". In this case, the function applied by the de-differentiating module 21 is also the function "XOR".

The output of the de-differentiating module 21 is also connected to an input of a de-conditioning module 23. This module is optional and is implemented when the data compression device comprises a conditioning module 10.

The de-conditioning module 23 carries out operations opposite to those carried out by the conditioning module 10. For example, if the conditioning comprises the passage from a "big endian" type encoding to a "little endian" type encoding, then the de-conditioning realises the opposite transformation.

The output signal of the module 23 is the signal of decompressed data produced by the decompression device according to the invention. Obviously, if the conditioning/de-conditioning operations are not implemented, then it is the output signal of the module 21 which is the signal of decompressed data produced by the decompression device according to the invention.

Figure 4:
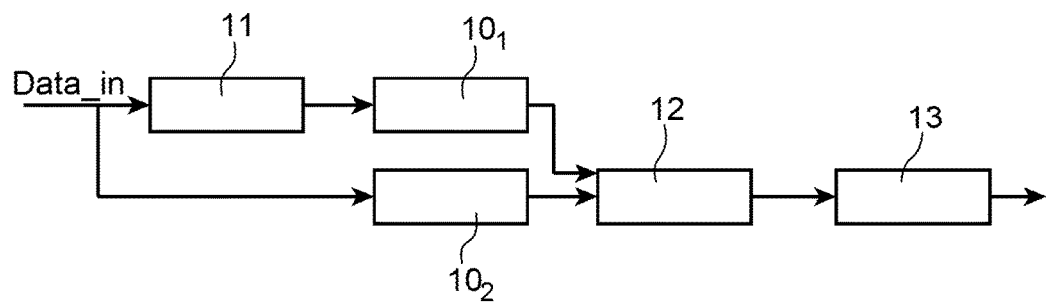
FIG. 4 represents a device for compressing digital data according to another embodiment of the invention.

FIG. 4 represents another embodiment of data compression device according to the invention.

Compared to the embodiment of FIG. 1, the optional conditioning module is displaced. More precisely, the data compression device comprises an extrapolation module 11, a differentiating module 12 and a module for deleting redundancy 13 which are analogous to those described previously and which are designated respectively by the same numerical references.

The data compression device comprises a first conditioning module $10_1$ between the output of the extrapolation module 11 and the first input of the differentiating module 12 and a second conditioning module $10_2$ connected to the second input of the differentiating module 12.

The conditioning of the data thus takes place just before the differentiation between the data to be compressed and the extrapolated data.

Figure 5:
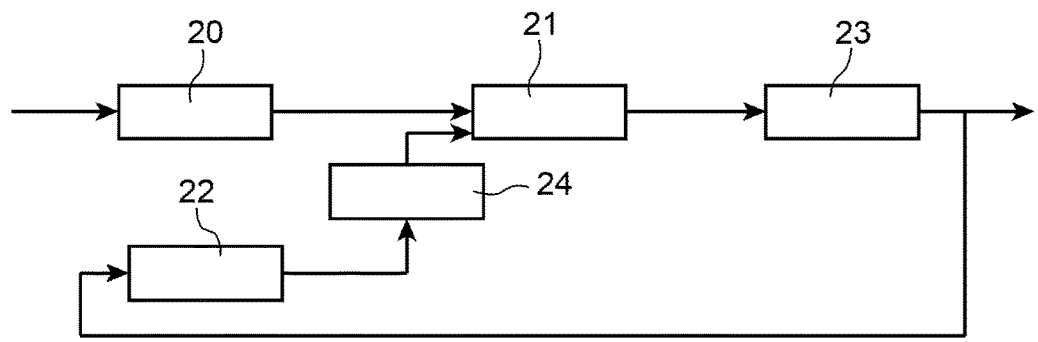
FIG. 5 represents a device for decompressing digital data according to another embodiment of the invention.

FIG. 5 represents another embodiment of data decompression device according to the invention, corresponding to the compression device of FIG. 4.

Compared to the embodiment of FIG. 3, the optional de-conditioning module is displaced. More precisely, the data decompression device comprises a de-concatenation module 20, a de-differentiating module 21 and an estimation module 22 which are analogous to those described previously and which are designated respectively by the same numerical references.

The de-concatenation 20 and de-differentiating 21 modules work on data that are conditioned. The data decompression device comprises a de-conditioning module 23 between the output of the de-differentiating module 21 and the output of the device. The estimation module 22 has an input connected to the output of the de-conditioning module 23. Thus, the estimation module 22 works on data that are not conditioned, like the extrapolation module 11 of the data compression device.

A conditioning module 24 is connected between an output of the estimation module 22 and an input of the de-differentiating module 21. Thus, the two inputs of the de-differentiating module 21 receive data that are conditioned. The conditioning carried out by the module 24 is identical to that carried out by the modules $10_1$ and $10_2$ of the data compression device described with reference to FIG. 4.

Figure 6:
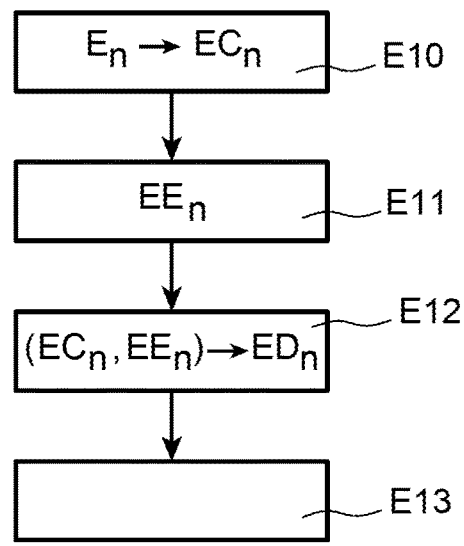
FIG. 6 represents a method for compressing digital data according to an embodiment of the invention.

FIG. 6 represents the operation of the data compression device of FIG. 1, in the form of a flow diagram comprising the steps E10 to E13.

Step E10 is a conditioning of the samples of data to be compressed $E_n$. This conditioning is optional. The conditioning of the data is a formatting of the data with the aim of facilitating the compression thereof.

The step of conditioning E10 produces samples of conditioned data to be compressed $EC_n$.

The following step E11 is an extrapolation realised on the conditioned samples $EC_n$. If conditioning is not carried out, extrapolation is carried out on the samples of data to be compressed $E_n$. Similarly, the later processing operations carried out on the conditioned samples are carried out on the samples of data to be compressed.

Different extrapolation functions may be implemented. Preferably, the extrapolation function depends on the nature of the signal to be compressed.

As an example, the extrapolation function estimates the value of the current sample $EC_n$ as a function of the value of at least one preceding sample $EC_{n-1}$, $EC_{n-2}$, etc. In this case, the extrapolation function is for example a copy of the preceding sample. It may also be a function, linear or not, of several preceding samples. Alternatively, it may further be a parabolic or exponential function.

The following step E12 is a differentiation carried out on each pair of conditioned sample and corresponding extrapolated sample ($EC_n$, $EE_n$). The differentiation implements a deterministic function which associates a single value of differentiated sample $ED_n$ with a pair of values of sample and corresponding extrapolated sample ($EC_n$, $EE_n$).

The values of conditioned sample $EC_n$ and corresponding extrapolated sample $EE_n$ are a priori close, if the extrapolation works well. The differentiating function exploits the redundancy existing between the values of conditioned sample $EC_n$ and corresponding extrapolated sample $EE_n$. For example, the extrapolation function is the function XOR applied bit by bit to the values of conditioned sample $EC_n$ and corresponding extrapolated sample $EE_n$. In an alternative, the extrapolation function is an unsigned subtraction.

The following step E13 is a deletion of redundancy in the differentiated samples $ED_n$. As an example, the deletion of redundancy is carried out as described with reference to FIG. 2.

In this case, the deletion of redundancy considers blocks of P successive values of differentiated samples and determines the redundancy between said P values. For example, the result is the number NB of successive most significant bits which have as value "0". The value P is predetermined, or in an alternative, it is variable and is encoded in the compression data.

The P successive values of differentiated samples are memorised then truncated from the NB successive redundant bits.

Finally, the P truncated values are concatenated. The result of step E13 is the signal of compressed data. This signal comprises words of which each corresponds to P processed values and is formed from the number NB and the P truncated values.

Figure 7:
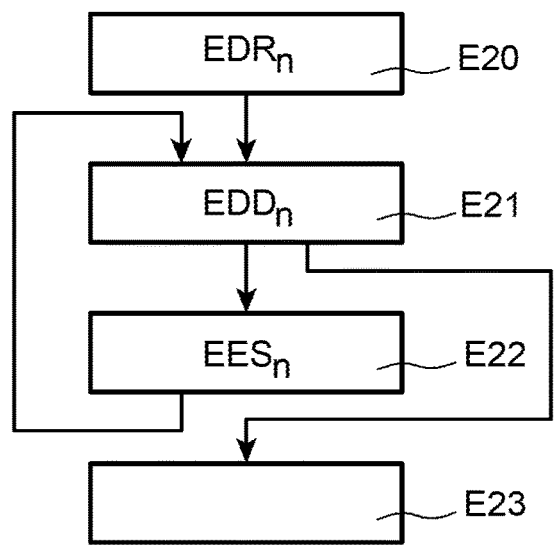
FIG. 7 represents a method for decompressing digital data according to an embodiment of the invention.

FIG. 7 represents the operation of the data decompression device of FIG. 3, in the form of a flow diagram comprising the steps E20 to E23.

Step E20 is a de-concatenation which carries out operations opposite to those of the step of deleting redundancy E13 described previously. This step comprises an actual de-concatenation of the compressed signal and a re-introduction of redundancy in the compressed signal.

In the case of a deletion of redundancy realised as in the example described with reference to FIG. 2, the number NB and the P truncated values of a received word are read. The NB bits that had been truncated are added to each of the P values of the received word. For example, NB most significant bits that have as value "0" are added to the truncated values. The values of the differentiated samples which represent the error of the extrapolation function applied by step E11 during data compression are thereby reconstituted. Step E20 has for result values of reconstituted differentiated samples $EDR_n$.

The following step E21 is a de-differentiation which applies to the reconstituted differentiated samples $EDR_n$ a function opposite to the function applied by the differentiating step E12 of the data compression method.

Step E21 produces a current de-differentiated sample $EDD_n$ as a function of the corresponding reconstituted differentiated sample $EDR_n$ resulting from step E20 and from a corresponding estimated sample $EES_n$ resulting from step E22 described hereafter.

The following step E22 is an estimation which uses a function identical to that used by the extrapolation step E11 of the data compression method. From the previously de-differentiated samples $EDD_n$ supplied by the de-differentiating step E21, the estimation step E22 produces estimated samples $EES_n$. For example, the estimation is a copy of the preceding sample: $EES_n = EDD_{n-1}$, where $EDD_{n-1}$ represents the previously de-differentiated sample.

These estimated samples $EES_n$ are used by the de-differentiating step E21 which applies a function opposite to the function applied by the differentiating step E12 of the data compression method. According to a preferred embodiment, the differentiating function is the function "XOR". In this case, the function applied by the de-differentiating module 21 is also the function "XOR".

Step E21 is also followed by step E23 of de-conditioning the de-differentiated samples $EDD_n$ produced at step E21. This step is optional and is implemented when the data compression method comprises a conditioning step E10.

The de-conditioning step E23 carries out operations opposite to those carried out by the conditioning step E10. For example, if the conditioning comprises the passage from a "big endian" type encoding to a "little endian" type encoding, then the de-conditioning realises the opposite transformation.

The signal produced at step E23 is the signal of decompressed data produced by the decompression method according to the invention. Obviously, if the conditioning/de-conditioning operations are not implemented, then it is the signal produced at step E21 which is the signal of decompressed data produced by the decompression method according to the invention.

According to another embodiment, the steps of conditioning and de-conditioning of the methods for compressing and decompressing data may be implemented respectively after the extrapolation and after the de-differentiation, by adding a step of conditioning between the estimation and the de-differentiation in the method for decompressing data.

The methods for compressing and decompressing data according to the invention may be implemented by one or more dedicated integrated circuit(s) or by programmable processors, or instead in the form of computer programmes memorised in the memory of a computer.

Figure 8:
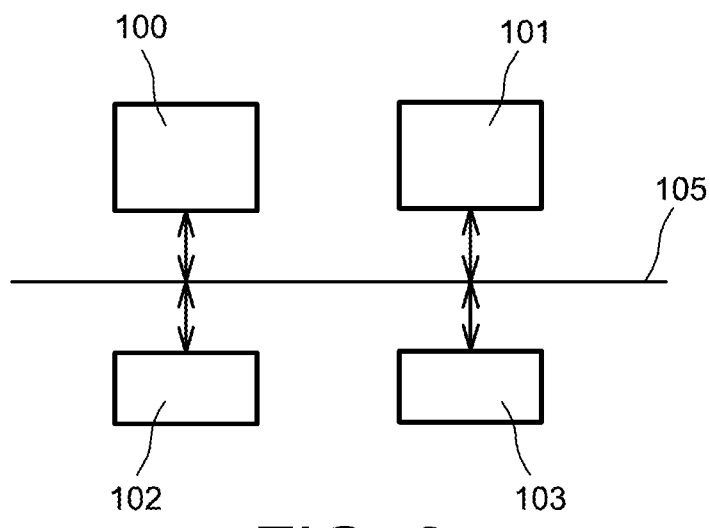
FIG. 8 represents a particular embodiment of implementation of data compression device according to the invention.

Thus, FIG. 8 represents a particular embodiment of implementation of the compression of data according to the invention.

The data compression device has the general structure of a computer. It notably comprises a processor 100 executing a computer programme implementing the method according to the invention, a memory 101, an input interface 102 and an output interface 103.

These different elements are conventionally connected by a bus 105.

The input interface 102 is intended to receive the data to be compressed.

The processor 100 executes the processing operations described previously. These processing operations are conducted in the form of code instructions of the computer programme which are memorised by the memory 101 before being executed by the processor 100.

The memory 101 may further memorise the results of the processing operations carried out.

The output interface 103 supplies the compressed data which may next be memorised and/or transmitted in a conventional manner.

Obviously, the method and the corresponding data decompression device are implemented in a similar manner. A same device can also implement the compression and the decompression of data.

The invention claimed is:

1. A method for compressing digital data, comprising:
    extrapolating a value of each sample of data to be compressed as a function of a value of at least one preceding sample of data to be compressed, to produce an extrapolated sample;
    differentiating between each extrapolated sample and a corresponding sample of data to be compressed, to produce a differentiated sample;
    deleting redundancy between successive differentiated samples produced by the differentiating.

2. A method for compressing digital data according to claim 1, wherein the extrapolation of the value of a sample of data to be compressed is a copy of the preceding sample.

3. A method for compressing digital data according to claim 1, further comprising conditioning each sample of data to be compressed to format the data to be compressed.

4. A method for compressing digital data according to claim 1, further comprising concatenating successive differentiated samples in which the redundancy has been deleted.

5. A method for decompressing digital data compressed by the method according to claim 1, comprising:
    re-introducing redundancy into the compressed data, to produce reconstituted samples;
    de-differentiating between each reconstituted sample and a corresponding estimated sample, to produce a de-differentiated sample;
    estimating a value of each following estimated sample from a value of at least one previously produced de-differentiated sample.

6. A method for decompressing digital data according to claim 5, wherein estimating the value of a following estimated sample is carried out by a same function as for extrapolation during data compression.

7. A data compression device, comprising:
    processing circuitry configured to
        extrapolate a value of each sample of data to be compressed as a function of a value of at least one preceding sample of data to be compressed, to produce an extrapolated sample;
        differentiate between each extrapolated sample and the corresponding sample of data to be compressed, to produce a differentiated sample;
        delete redundancy between successive differentiated samples.

8. A device for decompressing data compressed by the device according to claim 7, the processing circuitry being further configured to:
    re-introduce redundancy into the compressed data, to produce reconstituted samples;
    differentiate between each reconstituted sample and a corresponding estimated sample, to produce a de-differentiated sample; and
    estimate a value of each following estimated sample from a value of at least one previously produced de-differentiated sample.

9. A non-transitory computer readable medium storing a computer readable computer program comprising instructions, which when executed by a data compression device, cause the data compression device to perform a method comprising:
    extrapolating a value of each sample of data to be compressed as a function of a value of at least one preceding sample of data to be compressed, to produce an extrapolated sample;
    differentiating between each extrapolated sample and a corresponding sample of data to be compressed, to produce a differentiated sample;
    deleting redundancy between successive differentiated samples produced by the differentiating.

* * * * *